United States Patent [19]

Yen et al.

[11] Patent Number: 5,772,817
[45] Date of Patent: Jun. 30, 1998

[54] OPTICAL PELLICLE MOUNTING SYSTEM

[75] Inventors: Yung-Tsai Yen, Atherton; Qoang Rung Bih, San Jose, both of Calif.

[73] Assignee: Micro Lithography, Inc., Sunnyvale, Calif.

[21] Appl. No.: 797,875

[22] Filed: Feb. 10, 1997

[51] Int. Cl.[6] ............................. G03F 1/14; H01L 21/027
[52] U.S. Cl. ..................... 156/73.1; 156/108; 156/267; 156/272.8; 428/422; 430/5
[58] Field of Search ..................................... 156/108, 267, 156/272.8, 292, 73.1; 428/421, 422; 430/5; 359/350

[56] References Cited

U.S. PATENT DOCUMENTS

| | | |
|---|---|---|
| 4,470,508 | 9/1984 | Yen . |
| 4,737,387 | 4/1988 | Yen . |
| 4,759,990 | 7/1988 | Yen . |
| 5,168,993 | 12/1992 | Yen . |
| 5,203,961 | 4/1993 | Yen . |
| 5,254,375 | 10/1993 | Yen . |
| 5,271,803 | 12/1993 | Yen . |
| 5,300,348 | 4/1994 | Kubota et al. . |
| 5,305,878 | 4/1994 | Yen . |
| 5,314,728 | 5/1994 | Yen . |
| 5,332,604 | 7/1994 | Yen . |
| 5,339,197 | 8/1994 | Yen . |
| 5,453,816 | 9/1995 | Wang . |

FOREIGN PATENT DOCUMENTS

| | | |
|---|---|---|
| 3142294 | 6/1991 | Japan . |
| HEI 7-103536 | 4/1995 | Japan . |
| 8069103A | 3/1996 | Japan . |
| 8179495A | 7/1996 | Japan . |

*Primary Examiner*—Michael W. Ball
*Assistant Examiner*—Sam Chuan Yao
*Attorney, Agent, or Firm*—Kolisch Hartwell Dickinson McCormack & Heuser

[57] ABSTRACT

One aspect of the invention comprises a method of assembling an optical pellicle including a pellicle frame and a pellicle membrane in which adhesive is first applied to the pellicle frame, and then solvent in the adhesive is permitted to evaporate. Normally the step in which solvent is permitted to evaporate involves baking the frame with the adhesive thereon at an elevated temperature. The pellicle membrane is then placed over the adhesive covered frame, and a laser is used to bond the membrane to the frame. An additional, optional step to this process involves application of the laser to the outer edge of the pellicle membrane after the membrane is mounted to the pellicle frame to trim off excess membrane.

18 Claims, 1 Drawing Sheet

OPTICAL PELLICLE MOUNTING SYSTEM

BACKGROUND OF THE INVENTION

The present invention relates to optical pellicles, and more particularly to a system for mounting the pellicle membrane to the pellicle frame.

In the semiconductor chip industry it is well known that pattern transfer from a photomask to a substrate is accomplished by exposing the mask to a light source. During the pattern transfer process, also called the photolithographic process, patterns on the photomask are projected onto the substrate, which has been treated with a photosensitive substance. This results in the mask pattern being reproduced onto the substrate. Unfortunately, any foreign substance on the surface of the mask will also be reproduced on the substrate and therefore will interfere with proper pattern transfer to the substrate.

To eliminate contamination of the mask surface, a framed, thin membrane known as a pellicle is mounted on the mask surface, such that the pellicle membrane extends parallel to the mask at a predetermined distance spaced away from it. Any contamination that would ordinarily land on the mask surface instead falls onto the pellicle membrane.

Pellicles substantially eliminate the above problem because contamination on the pellicle membrane generally will not be projected onto the substrate. The frame of the pellicle supports the membrane at a distance spaced away from the mask surface so any particles or other contaminants on the pellicle membrane will be out of focus during pattern transfer.

The use of pellicles can assure the quality of the resulting chip, thereby improving chip fabrication productivity. Consequently, it is no surprise that pellicle manufacturing techniques have become increasingly important because high quality pellicles are critical to the success of the photolithographic process.

An optical pellicle must be highly transparent and extremely clean in order to perform its intended function. It is also essential that the pellicle membrane be securely mounted to its frame in order to maintain proper and uniform tension, across the surface of the membrane. Pellicle membranes are extremely thin, usually less than 5 $\mu$m, and therefore are often quite fragile.

In recent years, photolithography has involved the use of deep UV light with wavelengths less than 300 nanometers (nm) in order to permit the fabrication of circuits of increasingly smaller size. These deep UV pellicles are extremely thin, normally less than 2 $\mu$m, with thicknesses of 1.2 $\mu$m, 0.9 $\mu$m, and even 0.6 $\mu$m being common. Deep UV pellicles can be of greater thickness, but it is often difficult to precisely control the thickness in such pellicles in order to get the maximum transmission at a specific wavelength, such as 248 nm. Because these pellicle membranes are so thin, they are fragile, and can be difficult to mount to the pellicle frame. Moreover, the perfluoro polymers and other materials of which they are typically fabricated, usually have very low surface energy and are difficult to adhere to the pellicle frame. The use of these deep UV pellicles has therefore increased the likelihood of problems in adherence between the membrane and the frame.

Conventional adhesive systems often use adhesives which are cured using infra red (IR) light to heat and thereby cure the adhesive. While IR light normally is adequate to cure the adhesive and thereby bond the membrane to the pellicle frame, there are several inherent drawbacks with such a system. First, there is little control over the temperatures which are achieved during IR curing. Temperature control is becoming more critical in order to overcome or avoid mounting problems often associated with the newer deep UV pellicles. Also, it is very difficult to focus the IR light in such a way as to optimize the curing process. Also, it is possible that the light or heat from the lamps might damage the portion of the pellicle membrane which spans across the pellicle frame.

It is a general object of the present invention to provide a new method for manufacturing optical pellicles which overcomes the drawbacks and limitations of the prior art proposals. More specifically, an object of the invention is to develop a manufacturing method which provides an improved system for mounting a free-standing pellicle membrane to the pellicle frame, especially where the membrane is of the deep UV variety. Another object of the present invention is to provide a pellicle adhesion system which is readily suited to be a part of a highly automated, easily repeatable process using materials which are readily available.

SUMMARY OF THE INVENTION

One aspect of the invention comprises a method of assembling an optical pellicle including a pellicle frame and a pellicle membrane in which adhesive is first applied to the pellicle frame, and then solvent in the adhesive is permitted to evaporate. Normally the step in which solvent is permitted to evaporate involves baking the frame with the adhesive thereon at an elevated temperature. The pellicle membrane is then placed over the adhesive covered frame, and heat is generated in the pellicle membrane and adhesive, to bond the membrane to the frame.

An additional, optional step to this process involves generation of localized heat in the outer edge of the pellicle membrane after the membrane is mounted to the pellicle frame, to trim off excess membrane.

Various other features, objects and advantages of the present invention will become more fully apparent as this description continues.

DETAILED DESCRIPTION OF THE PREFERRED EMBODIMENTS

Figure 1:
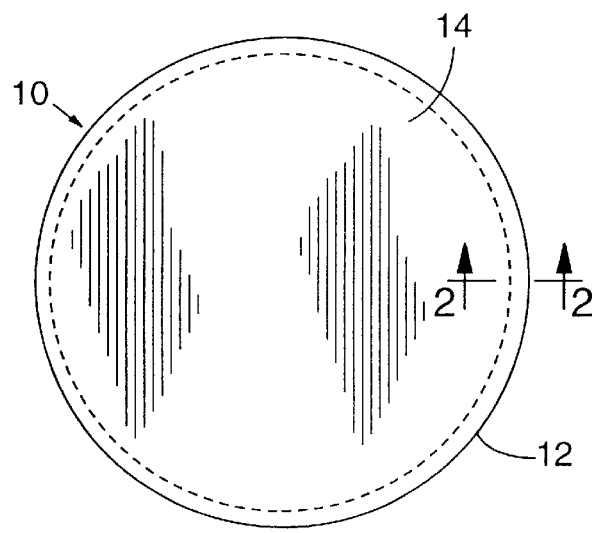
FIG. 1 is a top plan view of an optical pellicle constructed in accordance with the present invention.
Figure 2:
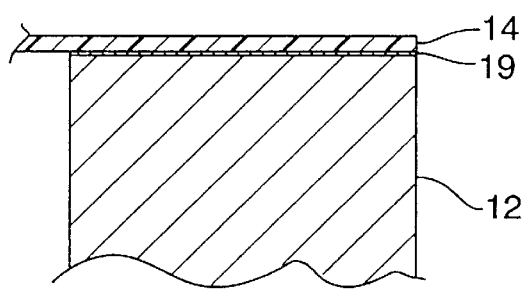
FIG. 2 is an enlarged fragmentary side elevation sectional view taken along line 2—2 of FIG. 1, with the thickness of the pellicle membrane being exaggerated for illustration purposes.

FIGS. 1 and 2 depict a conventional pellicle 10, including a pellicle frame 12 with a pellicle membrane 14 bonded to it by an adhesive layer 19. The pellicle frame 12 is typically fabricated of anodized aluminum, although it could alternatively be formed of stainless steel, plastic or other materials. The pellicle membrane 14 is extremely thin, in the range of about 0.5 $\mu$m to 5 $\mu$m, and is uniform and highly transparent. As noted above, a deep UV pellicle membrane is typically between 0.5 $\mu$m to 2 $\mu$m. Many pellicle membranes are fabricated of nitrocellulose or cellulose acetate, while deep UV pellicle membranes are commonly fabricated of a fluoropolymer such as Cytop® from Asahi Glass or Teflon® AF fluorocarbon amorphous polymer from DuPont.

Deep UV pellicles typically are utilized at photolithography operations involving wavelengths such as 248 nanometers, and possibly 193 nanometers. In the preferred embodiment of the present invention, the deep UV pellicle is fabricated of poly-perfluoro polymer containing a cyclic ether functional group, such as poly-perfluoro cyclo oxyaliphatic polymer formulation of Cytop® identified as CTX-808-SP2. The numerals "08" identify the solution as an 8% solution. This solution is typically spun onto a substrate, the solvent is baked off, and the membrane is removed from the substrate in a peeling operation.

The membrane may alternatively be formulated of Teflon AF amorphous fluoropolymer from DuPont. Teflon AF fluorocarbon is a family of amorphous copolymers of perfluoro. (2,2-dimethyl-1,3 dioxole)(PDD) and tetrafluoroethylene. Teflon AF fluorocarbon is typically based on 2,2-bistrifluoromethyl-4,5-difluoro-1,3-dioxole with fluorine-containing monomers. Two polymers which work particularly well are Teflon AF1600 and AF1601 fluorocarbon amorphous polymers. This is a solution of Teflon AF amorphous fluoropolymer dissolved in Fluorinert FC-75 from 3M.

In order to bond the pellicle membrane to the pellicle frame, it is necessary to select an adhesive that will provide sufficient bonding but will not destroy or damage the integrity of the membrane, which is usually less than 2$\mu$m ($2\times10^{-6}$ meter) thick. The bonding of deep UV pellicle membranes to their frames has been a particularly troublesome problem ever since fluoropolymer deep UV pellicles were first introduced several years ago. With conventional nitrocellulose or cellulose acetate membranes, adhesives such as light sensitive Norland NOA 61 has been entirely satisfactory, but this type of adhesive is ineffective with the fluoropolymer materials used in deep UV pellicles.

It has been found that a suitable adhesive for the materials used in deep UV pellicle membranes is the pellicle material itself except with a lower Tg. Thus, for example, for a membrane fabricated of poly-perfluoro polymer containing a cyclic ether functional group, a suitable adhesive would be a fluorinated polymer containing a cyclic ether functional group. Or, a suitable adhesive for the poly-perfluoro cyclo-oxyaliphatic polymer membrane described above, is a poly-perfluoro cyclo oxyaliphatic formulation designated by Asahi as CTL-816-AP, which is an analog of the membrane solution CTX-808-SP2. The solid CTL material does, however, have a lower Tg than the CTX material. Alternatively, fluorinated cyclic ether polymer can be utilized as an adhesive. The numeral "16" identifies this as a 16% solution, which is typically in a solvent designated by Asahi as CT-solvent 180. The adhesive is typically applied to the pellicle frame as it is provided from Asahi.

The adhesive is applied to the pellicle frame, typically in an automated dispensing operation, and the solvent in the adhesive is allowed to evaporate. This evaporation step is normally performed by baking the pellicle frame in an industrial, clean oven. Whether or not the evaporation step involves baking in an oven, may not remove all of the solvent, but it does result in the adhesive being substantially dried and non-tacky. Thus, when one step of this process is described as "permitting solvent in the adhesive to evaporate", this does not necessarily mean that all of the solvent is evaporated.

In order to mount the pellicle membrane to the pellicle frame, solvent is applied to the dried adhesive on the pellicle frame. Because the pellicle membrane is so thin, solvent control is critical. Too much solvent could result in a broken or wrinkled pellicle membrane as a result of the solvent dissolving excessive amounts of the pellicle membrane after the membrane is applied to the frame. Too little solvent could result in insufficient bonding between the membrane and the adhesive on the frame.

After the solvent is applied to the dried adhesive, the solvent typically only dissolves the outer or upper portion of the dried adhesive. This way there is sufficient adhering taking place to completely bond the membrane, but excessive solvent will not be present on the adhesive to damage the working portion of the membrane which extends across the pellicle frame. The solvent utilized in this operation is normally FC40, FC43 or FC77 from 3M, or a mixture of two of these. A single solvent may be utilized, but in practice, for better control, a 20/80% mixture of two of the solvents, such as FC40 and FC77, is used. Other ratios might be preferable for particular applications. The use of this mixture at approximately these ratios results in a formulation in which the FC77 will evaporate before the FC40, thereby resulting in greater control of the mounting process. Other solvents may alternatively be used, but it is preferable that a mixture of at least two solvents be utilized, with the solvents having differing boiling points, perhaps by as much as 10° C. or more.

After application of the solvent or co-solvent, the pellicle membrane is applied. This is done after the adhesive becomes tacky, and not too much of the solvent is left, which may vary from a few seconds to several hours, depending on the solvents. With the noted solvents, it has been realized that the pellicle membrane can be applied in less than 120 seconds after application of the solvent.

Figure 3:
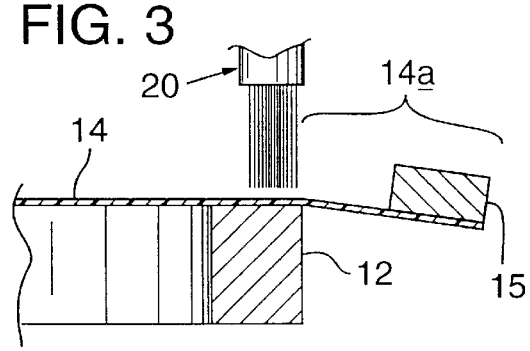
FIG. 3 is a view similar to that of FIG. 2 except that it is not so enlarged; it schematically depicts a laser used for further bonding the membrane to the frame.

The pellicle membrane 14 is then mounted to the pellicle frame by pressing the membrane against the adhesive-coated frame, using a perimeter frame 15 such as that shown in FIG. 3. This perimeter frame 15 is normally the frame on which the pellicle membrane 14 is fabricated. The weight of the perimeter frame 15 is normally sufficient to ensure that the pellicle membrane 14 will be taut across the pellicle frame 12 as shown in FIG. 3.

Finally, once the membrane has bonded to the adhesive, the excess portion of the membrane is cut or trimmed away, using a knife. Any rough edge which may be left is cleaned by applying a solvent, such as one of those described above, to the outer edge of the membrane.

Figure 5:
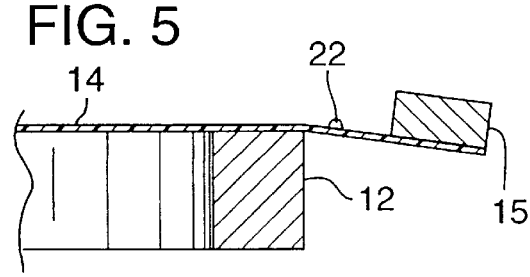
FIG. 5 is a view corresponding to that of FIG. 3, showing the use of a protective bead of hot melt glue, with the laser deleted merely to simplify the Figure.
Figure 6:
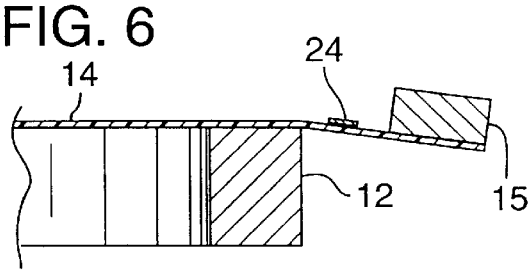
FIG. 6 is a view corresponding to that of FIG. 3, showing the use of a protective piece of tape, with the laser deleted merely to simplify the Figure.

In some applications, as shown in FIG. 5, it might be desirable to apply a tear barrier in the form of a bead of hot melt glue 22 around the frame close to the outer edge thereof in a pattern concentric with the outer edge. The hot melt glue would normally be solidifiable fluid polymeric material. A bead of hot melt glue could be disposed directly over the outer edge of the frame, or could be disposed outwardly thereof as described in U.S. Pat. No. 5,254,375 and as depicted in FIG. 5, the disclosure of such patent being incorporated herein by reference. Or, as shown in FIG. 6, the tear barrier may be in the form of a thin line of tape 24, in a similar pattern following the shape of the pellicle, which could be applied to the pellicle membrane. In either case, the glue 22 or tape 24 would prevent a runaway tear from damaging the pellicle membrane 14 during the trimming or cutting step, whether that operation is performed using a knife or the laser 20 described above.

A variation of the above process is to entirely eliminate the step of applying solvent or co-solvent after the adhesive has been permitted to dry on the pellicle frame. In this variation, the pellicle membrane would merely be mounted in place on the adhesive, and then heat would be generated in the pellicle membrane and adhesive, to bond the membrane to the frame. This would preferably be performed using a laser, but it could alternatively involve use of a heat gun or ultrasound technology. In any event, the heat is normally generated in a localized area, by a beam which is thinner than the width of the pellicle frame. The frame has an inner edge and an outer edge, and the heat is typically generated in the membrane at a region spaced from the inner and outer edges. The heat would typically be generated at a region closer to the outer edge than to the inner edge.

A typical pellicle mounting process will now be described, using the materials set forth above.

EXAMPLE ONE

Apply CTL-816-AP to the pellicle frame 12. Bake the frame with the adhesive thereon in an oven at 75°±1° C. for 4–5 hours or until the adhesive is dry. Prepare a mixture of FC40 and FC77 in a 20/80% ratio, and then apply this co-solvent mixture to the baked adhesive on the frame using a sponge Q-tip and wait for a few seconds while the solvent dissolves the top portion of the baked adhesive so that the previously-applied adhesive becomes tacky. A pellicle membrane 14, fabricated of poly-perfluoro cyclo oxyaliphatic polymer as set forth above, is then mounted to the tacky adhesive. Excess membrane is then trimmed from the frame using a knife, and the peripheral edge is cleaned using a solvent such as one of those set forth above.

Once the membrane has been mounted as described in Example One, it may be desirable in some applications to further bond the pellicle to the frame using a heat source, and preferably a localized heat source such as a laser, a heat gun or through the use of ultrasound technology. A suitable laser, identified at 20 in FIG. 3, is an infrared $CO_2$ laser such as that marketed by Synrad, Inc. of Bothell, Wash. under the designation Series 48 laser "E" version. This laser is applied in sufficient intensity and for a sufficient time that it generates heat in the pellicle membrane and adhesive and thereby bonds the adhesive to the frame but does not dissolve the entire membrane or cause it to winkle. It has been determined that when a 20 watt $CO_2$ laser is used, it can be set at a low energy setting and have the capability to partially melt the membrane and adhesive without breaking the membrane, thereby bonding the membrane to the adhesive. The speed at which the laser passes around the pellicle frame can provide additional control for this process. The use of similar materials for the membrane and the adhesive as described above (with the adhesive having a lower Tg than the membrane material) has been shown to provide greater control to the process.

While the laser has been identified at 20, this laser may alternatively be a heat gun or an ultrasound application tool. Such a gun or tool would be depicted as shown at 20 in FIGS. 3 and 4. These drawings have not been redone showing such a gun or tool because the gun or tool would appear much as the laser does in those figures.

EXAMPLE TWO

Once the membrane has been mounted as set forth in Example One, the laser is utilized to further bond the pellicle membrane 14 to the pellicle frame 12, and an example of that process will now be described.

The beam in the Synrad $CO_2$ laser is confined to a localized area which is normally tinner than the width of the pellicle frame. It can be focused, for example, using a lens or by using fiber optics. It is preferable to use a beam size which is less than the width of the pellicle frame 12, typically 2 mm. A beam size of about 1.5 mm is depicted in FIG. 1 and is used in this example. The laser is spaced above the pellicle membrane, and the center of the laser beam is displaced outwardly, approximately two thirds of the way from the inner to the outer edge, as shown schematically in FIG. 3. This is to minimize the possibility of damage to the portion of the pellicle membrane which extends inwardly from the pellicle frame which is positioned over the photomask. The use of this laser as described will normally result in the surface temperature being between the Tg temperature of the adhesive and the melting temperature of the polymer. The laser is then passed entirely around the frame, using an XY automated platen, thereby further bonding the membrane to the frame by causing the membrane and adhesive to at least partially melt and bond to one another.

Figure 4:
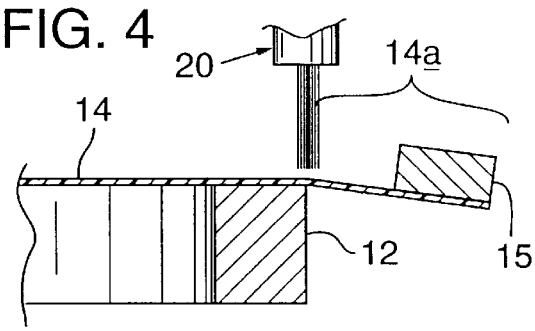
FIG. 4 is a view corresponding to that of FIG. 3, except that the laser is shown positioned to cut away the excess portion of the membrane.

It is possible to expedite the pellicle assembly operation by applying the laser before the cutting and trimming steps set forth above. In this instance, following the bonding step set forth in Example Two, the focus of the laser would be further defined, and/or the intensity of the beam would be increased, and is shifted to the outer edge of the pellicle frame as schematically depicted in FIG. 4. The laser would then be energized to cut the excess membrane through the generation of localized heat in the membrane, as schematically depicted at 14a in FIG. 4, instead of using the knife to perform the membrane cutting step. This excess portion of membrane 14a would of course normally be supported by an outer frame, which has not been shown in the drawings. Once this laser cutting operation is completed, solvent could again be used to trim the edge as set forth above, although in certain applications the heat generated by the laser cutting may be such that the final solvent application step may be eliminated.

EXAMPLE THREE

Apply CTL-816-AP to the pellicle frame 12. Bake the frame with the adhesive thereon in an oven at 75°±1° C. for four to five hours or until the adhesive is dry. A laser is then used to bond the membrane to the adhesive on the frame as set forth in Example Two. The cutting and trimming steps would also be as set forth in Example Two.

Other variations of the preferred embodiments are intended to be encompassed by the claims which follow.

It is claimed and desired to secure by letters patent:

1. A process for mounting an optical pellicle membrane to an optical pellicle frame, comprising:

selecting a pellicle frame corresponding to the shape of the desired pellicle, wherein the pellicle frame has an inner edge and an outer edge;

applying adhesive containing a solvent to the pellicle frame;

heating the pellicle frame to evaporate the solvent;

fabricating a pellicle membrane;

mounting the pellicle membrane to the adhesive on the pellicle frame; and generating heat in the pellicle membrane and the adhesive after the membrane has been mounted to the adhesive on the pellicle frame, to bond the membrane to the frame, wherein the step of generating heat consists of heating the membrane and the adhesive in a region closer to the outer edge than the inner edge of the pellicle frame.

2. The process of claim 1 wherein the heat is generated using a laser.

3. The process of claim 1 wherein the heat is generated using a heat gun.

4. The process of claim 1 wherein the heat is generated using ultrasound.

5. The process of claim 1 wherein the heat is generated in a localized area.

6. The process of claim 5 wherein the heat is generated by a beam which is thinner than the width of the pellicle frame.

7. The process of claim 1, further comprising cutting any portion of the membrane extending over the outer edge of the pellicle frame through the generation of localized heat in the membrane, following the step of generating heat in the pellicle membrane and adhesive.

8. The process of claim 7, further comprising narrowing the area of heat generation before cutting any portion of the membrane.

9. The process of claim 7, further comprising increasing the intensity of the generated heat before cutting any portion of the membrane.

10. The process of claim 8 wherein the area of heat generation is narrowed using a lens focusing system.

11. The process of claim 8 wherein the area of heat generation is narrowed using fiber optics.

12. The process of claim 1 wherein the step of fabricating the membrane fabricates the membrane of poly-perfluoro polymer containing a cyclic ether functional group.

13. The process of claim 12 wherein the step of fabricating the membrane fabricates the membrane of poly-perfluoro cyclo oxyaliphatic polymer.

14. The process of claim 1 or 2 wherein the step of applying adhesive applies a fluorinated polymer containing a cyclic ether functional group.

15. The process of claim 1 or 2 wherein the step of applying adhesive applies a poly-perfluoro cyclo oxyaliphatic polymer.

16. The process of claim 1 wherein the step of fabricating the membrane fabricates the membrane of a Teflon amorphous fluoropolymer.

17. The process of claim 1 wherein the step of fabricating the membrane fabricates the membrane of amorphous copolymers of perfluoro (2,2-dimethyl-1,3 dioxole) (PDD) and tetrafluoroethylene.

18. The process of claim 1 wherein the step of heating the pellicle frame to evaporate the solvent comprises baking the frame with the adhesive thereon at an elevated temperature.

* * * * *